(12) United States Patent
Brindisi

(10) Patent No.: US 8,872,420 B2
(45) Date of Patent: Oct. 28, 2014

(54) VOLUMETRIC THREE-DIMENSIONAL DISPLAY WITH EVENLY-SPACED ELEMENTS

(71) Applicant: Thomas J. Brindisi, Key West, FL (US)

(72) Inventor: Thomas J. Brindisi, Key West, FL (US)

(*) Notice: Subject to any disclaimer, the term of this patent is extended or adjusted under 35 U.S.C. 154(b) by 0 days.

(21) Appl. No.: 14/210,470

(22) Filed: Mar. 14, 2014

(65) Prior Publication Data

US 2014/0264405 A1  Sep. 18, 2014

Related U.S. Application Data

(60) Provisional application No. 61/800,453, filed on Mar. 15, 2013.

(51) Int. Cl.
  H05B 33/00  (2006.01)
  H01L 27/15  (2006.01)

(52) U.S. Cl.
  CPC .................................. *H01L 27/153* (2013.01)
  USPC ....................................... 313/498; 315/169.3

(58) Field of Classification Search
  CPC . G02B 27/2271; G02B 27/2278; F21S 2/005; F21Y 2111/001; F21Y 2111/007; F21Y 2111/008; F21Y 2111/0078; H01L 25/0756
  USPC ............................ 313/498; 345/76; 315/169.3
  See application file for complete search history.

(56) References Cited

U.S. PATENT DOCUMENTS

| | | | |
|---|---|---|---|
| 2,749,480 A | 6/1956 | Ruderfer | |
| 3,636,551 A | 1/1972 | Maguire | |
| 4,134,104 A | 1/1979 | Karras | |
| 5,037,105 A | 8/1991 | Klein | |
| 5,703,436 A | * 12/1997 | Forrest et al. | 313/506 |
| 5,801,666 A | 9/1998 | MacFarlane | |
| 5,929,572 A | 7/1999 | Whitesell | |
| 6,720,961 B2 | 4/2004 | Tracy | |
| 6,721,023 B1 | 4/2004 | Weiss et al. | |
| 7,057,581 B1 | 6/2006 | Knabenbauer | |
| 7,190,328 B1 | 3/2007 | Clar | |
| 7,345,658 B2 | 3/2008 | Chuman et al. | |
| 7,587,120 B2 | 9/2009 | Koo et al. | |
| 7,667,396 B2 | 2/2010 | Chao | |
| 8,018,568 B2 | 9/2011 | Allemand et al. | |
| 8,129,710 B2 | 3/2012 | Cho et al. | |
| 8,129,904 B2 | 3/2012 | Ku | |
| 8,149,353 B2 | 4/2012 | Bell et al. | |
| 8,253,652 B2 | 8/2012 | Koo et al. | |

(Continued)

FOREIGN PATENT DOCUMENTS

| | | |
|---|---|---|
| DE | 102008007287 | 8/2009 |
| DE | 102012100426 A1 | 7/2013 |
| GB | 2376555 | 12/2002 |

OTHER PUBLICATIONS

Li, "Point sampling optimization strategy and performance analysis for a true 3D display system". Jun. 2008.*

(Continued)

*Primary Examiner* — Andrew Coughlin

(57) ABSTRACT

A volumetric three-dimensional light-emitting display, comprising an array of elements arranged, as defined by the relative positions of the elements' centerpoints, in a close-packed relationship; and an array of conductors in electrical contact with the array of elements. The array of elements comprises voxels consisting of four elements and capable of producing full-color.

30 Claims, 5 Drawing Sheets

(56) References Cited

U.S. PATENT DOCUMENTS

| | | | |
|---|---|---|---|
| 8,319,791 | B2 | 11/2012 | Ueki et al. |
| 8,414,345 | B2 | 4/2013 | Cho |
| 8,525,954 | B2 | 9/2013 | Li et al. |
| 2004/0145538 | A1 | 7/2004 | Uchida et al. |
| 2004/0150584 | A1 | 8/2004 | Chuman et al. |
| 2004/0169619 | A1 | 9/2004 | Hata et al. |
| 2004/0212551 | A1 | 10/2004 | Okuda et al. |
| 2004/0246199 | A1 | 12/2004 | Ramian |
| 2009/0078955 | A1 | 3/2009 | Fan et al. |
| 2009/0128034 | A1* | 5/2009 | Ku .............................. 313/584 |
| 2009/0179852 | A1 | 7/2009 | Refai et al. |
| 2009/0273607 | A1* | 11/2009 | Ueki et al. .................... 345/590 |
| 2010/0308353 | A1 | 12/2010 | Grabowski et al. |
| 2011/0094651 | A1 | 4/2011 | Kuriki |
| 2011/0222287 | A1 | 9/2011 | Lee |
| 2012/0146885 | A1 | 6/2012 | Jung |

OTHER PUBLICATIONS

Cho et al., "Highly transparent organic light-emitting diodes with a metallic top electrode: the dual role of a Cs2CO3 layer," Optics Express 19:2, pp. 1113-1121, Jan. 17, 2011.

Guizar-Sicairos et al., "Efficient subpixel image registration algorithms," Optics Letters 33:2, pp. 156-158, Jan. 15, 2008.

Spaid, "Frontline Technology: Wet-Processable Transparent Conductive Materials," Information Display 28:1, pp. 10-15, Jan. 2012.

Zhejiang Kechuang Advanced Materials Tech. Co., Ltd. specification sheet titled "Silver Nanowires for Flexible Transparent Electrode," at www.ke-chuang.com, accessed Jan. 28, 2013.

Chung et al., "Solution-Processed Flexible Transparent Conductors Composed of Silver Nanowire Networks Embedded in Indium Tin Oxide Nanoparticle Matrices," Nano Research 5:11, pp. 805-14, Nov. 2012.

Zeng et al., "A New Transparent Conductor: Silver Nanowire Film Buried at the Surface of a Transparent Polymer," Advanced Materials 22:40, pp. 4484-88, Oct. 25, 2012.

Hu et al., "Scalable Coating and Properties of Transparent, Flexible, Silver Nanowire Electrodes," ACS NANO 4:5, pp. 2955-63, May 25, 2010.

Spechler et al., "Direct-write pulsed laser processed silver nanowire networks for transparent conducting electrodes," Applied Physics a: Materials Science & Processing 108:1, pp. 25-28, Jul. 2012.

Hecht et al., "Transparent conductive carbon-nanotube films directly coated onto flexible and rigid polycarbonate," Journal of the Society for Information Display 19:2, pp. 157-62, Feb. 2011.

Moon et al., "2D Graphene Oxide Nanosheets as an Adhesive Over-Coating Layer for Flexible Transparent Conductive Electrodes," Scientific Reports 3:1112, pp. 1-7, Jan. 23, 2013.

Hanemann, "Tuning the polymer refractive index with nanosized organic dopants," SPIE Newsroom, Nov. 5, 2008.

Mackey, Norlux White Paper titled "Intelligent Color Mixing for LEDs to achieve Uniform Colors," at http://www.norluxcorp.com/pdficolor_mixing.pdf, Mar. 20, 2012.

"Tetrahedron Packing," at http://en.wikipedia.org/wiki/Tetrahedron_packing, accessed Feb. 4, 2013.

"Sphere packing," at http://en.wikipedia.org/wiki/Sphere_packing, accessed Feb. 4, 2013.

"Close-packing of equal spheres," at http://en.wikipedia.org/wiki/Close-packing_of_equal_spheres, accessed Feb. 4, 2013.

"Root system," at http://en.wikipedia.org/wiki/Root_system, accessed Feb. 4, 2013.

"Cubic crystal system," at http://en.wikipedia.org/wiki/Cubic_crystal_system, accessed Feb. 4, 2013.

"The Four Color Theorem," at http://www.mathpages.com/home/kmath266/kmath266.htm, accessed Jan. 30, 2013.

Bangert, "An Analysis of Quattron," Appendix C to Queen Mary University of London thesis paper titled "Colour: An algorithmic approach," pp. 93-98, at http://www.eecs.qmul.ac.uk/~tb300/pub/PhD/Stage1Report.pdf, accessed Mar. 14, 2014.

Wyatt et al., "A Volumetric 3D LED Display," Final project report, MIT 6.111: Introductory Digital Systems Laboratory, 2005.

Wyatt et al., "Volumetric LED display," archived version of http://www.davidwyatt.me.uk/ledcube/ Jun. 2007.

Yordanov, "Optimal Sub-Pixel arrangements and coding for ultra-high resolution three-dimensional OLED displays," Doctoral Dissertation, Faculty of Electrical and Computer Engineering of the University Kassel, 2007.

Wu et al., "Organic Light-Emitting Diodes on Solution-Processed Graphene Transparent Electrodes," ACS Nano, 2010, 4(1), p. 43-48.

Park, "3D Volumetric Display," retrieved at https://na5.brightidea.com/ct/getfile.bix?a=OD4812&f=A9529C90-F8F7-4AC0-8EFA-D934904189A5.

Li et al., "Points sampling optimization strategy and performance analysis for a true 3D display system," Journal of Shandong University (Engineering Science), Jun. 2008, vol. 38:3, p. 1-6.

Liang, "Research on Volumetric Display Technology Based on Scatterer Lattice," Master Thesis, Nanjing University of Aeronautics and Astronautics, Feb. 2011.

Liang et al., "True-3D Display Based on Scatterer Space Lattice," Computer Applications and Software, Jan. 2011, vol. 28:1, p. 256-58.

* cited by examiner

VOLUMETRIC THREE-DIMENSIONAL DISPLAY WITH EVENLY-SPACED ELEMENTS

CROSS-REFERENCE TO RELATED PATENT APPLICATION

This application claims benefit of the priority of provisional application Ser. No. 61/800,453 filed with the same title on Mar. 15, 2013, and incorporates by reference the contents of said application.

FIELD OF THE INVENTION

The present invention relates to three-dimensional displays, and in particular to volumetric, three-dimensional displays.

BACKGROUND

It is believed that hitherto, the obvious, realistically useful way to lay out a three-dimensional display comprising light emitting diodes has been to utilize identical layers (e.g., a two-dimensional OLED display) that repeat directly upwardly in the z axis, one atop the next. This has been done at least since U.S. Pat. No. 5,929,572 to Whitesell and GB Patent Application 2376555 to Eickhoff, through U.S. Patent Application Publication No. 2004/0145538 to Uchida et al., U.S. Pat. No. 6,720,961 to Tracy, U.S. Patent Application Publication No. 2009/0002266 (now issued as U.S. Pat. No. 8,525,954) to Li et al., and U.S. Pat. No. 7,587,120 to Koo et al.

Work in the LED television and monitor field, though extensive, is 'pixel-centric' (and likely moreso with OLED's rise), and conventional two-dimensional pixels arrays are not prone to being stacked to create a three-dimensional volumetric display in any arrangement other than identical, direct stacks. Further, it is believed that where those in the field have deliberately controlled the relative distancing of layers from one another in stacked volumetric displays (e.g., DE 102008007287), it has been for purposes other than (and not consistent with) establishing a three-dimensionally regular voxel or a three-dimensionally even element spacing.

Even if one in the field had contemplated trying to depart from the existing model, and if they happened to consider the notion of space-filling in the process, the possibility of employing an arrangement of elements that is derived from the geometry of the close-packing of spheres would not have appeared to be a good candidate. For one thing, a spherical voxel would be impractical to construct. (A voxel might be formed of a spherical-shaped diffusing material, but the opacity of the resulting extent of diffusing material is not desirable for a volumetric three-dimensional display, if not untenable depending on the density and depth of elements). In any case, when densely-packed, equal spheres leave numerous gaps of two different shapes and only fill about 74% of space; similarly with the regular tetrahedrons that are formed by connecting the centerpoints of close-packed equal spheres. Further, the standard group of emitters used to generate full color (e.g., 256+ colors) LED displays comprises three emitters (red, green, and blue, or RGB), with other groups that consist of more or less than three emitters now receiving comparatively little (and often diminishing) attention; if a space-filling approach would have been entertained hitherto, the approach would also have been repelled by the lack of advantage to laying out R, G, and B emitters in a three-dimensional pattern.

SUMMARY OF THE INVENTION

Despite the fact that regular tetrahedral structures cannot fully tessellate a volume, Applicant has found that by utilizing a close-packed lattice arrangement of elements in a novel A volumetric three-dimensional display, certain key functional advantages can be derived that generate meaningfully enhanced performance. Utilizing voxels consisting of four elements and capable of producing full color in this arrangement permits a scheme wherein a smooth and uniform flow of voxels and boundaries that is impossible in the conventional arrangement can be achieved.

BRIEF DESCRIPTION OF THE DRAWINGS

FIGS. 2A-5B are sectional views of an embodiment that is based on FIG. 1 but further includes an encapsulant, wherein:

FIG. 2A shows a plane that is parallel to the one that generally appears as the top face of the roughly cube-shaped array of FIG. 1, the depicted plane being like one indicated in FIG. 1 with the set of dashed lines indicated by RG;

FIG. 2B shows a plane that is parallel to the plane of FIG. 2A, the depicted plane being like one indicated in FIG. 1 with the set of dashed lines indicated by BY;

FIG. 5B shows a plane of a type that is found between the planes depicted in FIGS. 2A & 2B, and is found between the planes depicted in FIGS. 4A & 4B.

DETAILED DESCRIPTION OF EMBODIMENTS

Figure 1:
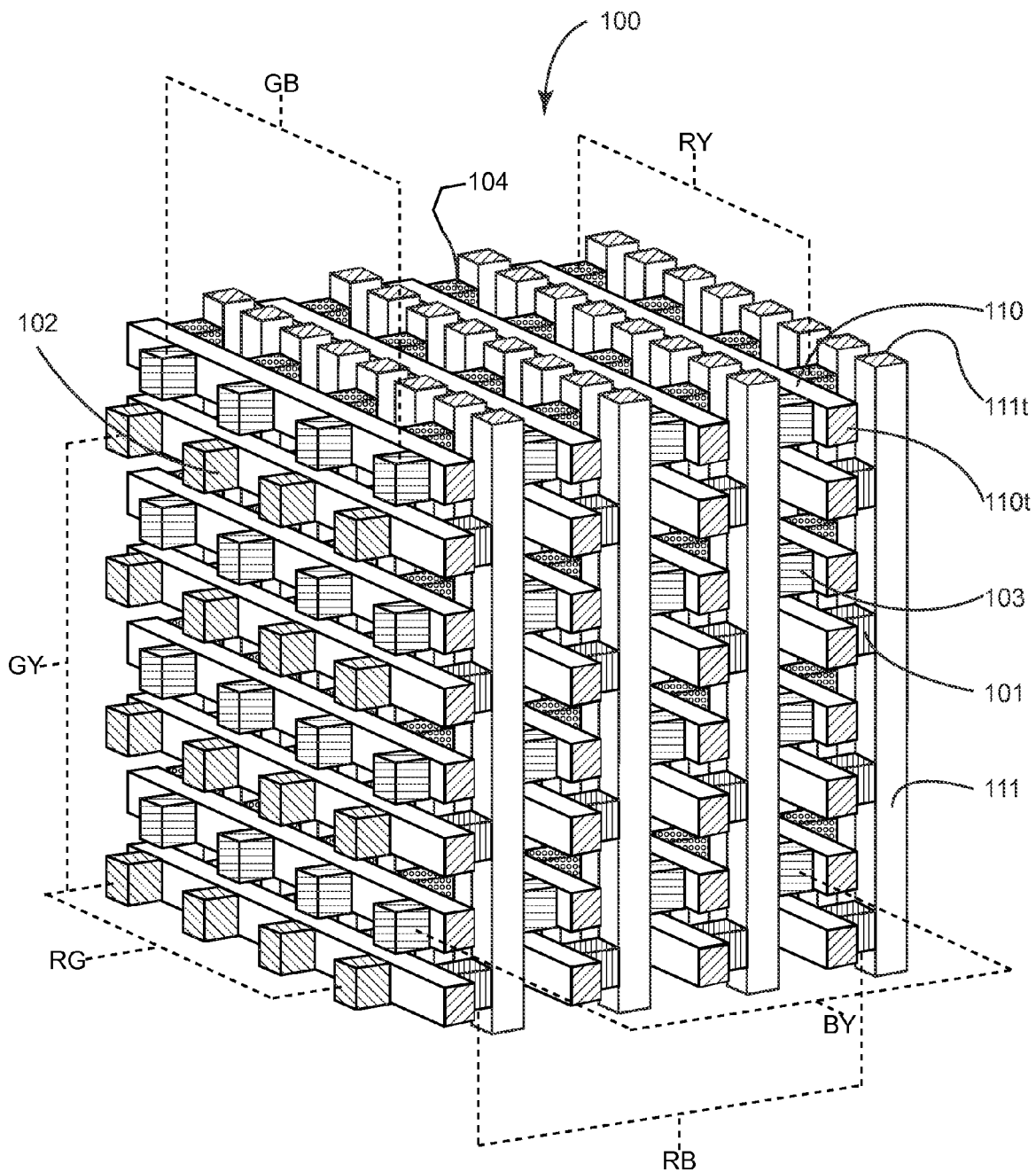
FIG. 1 is a partial perspective view illustrating the structural and functional arrangement of an embodiment of the invention that is arranged in a face-centered cubic array with a three-dimensional arrangement of four sets of differently-colored emitters.
Figure 2A:
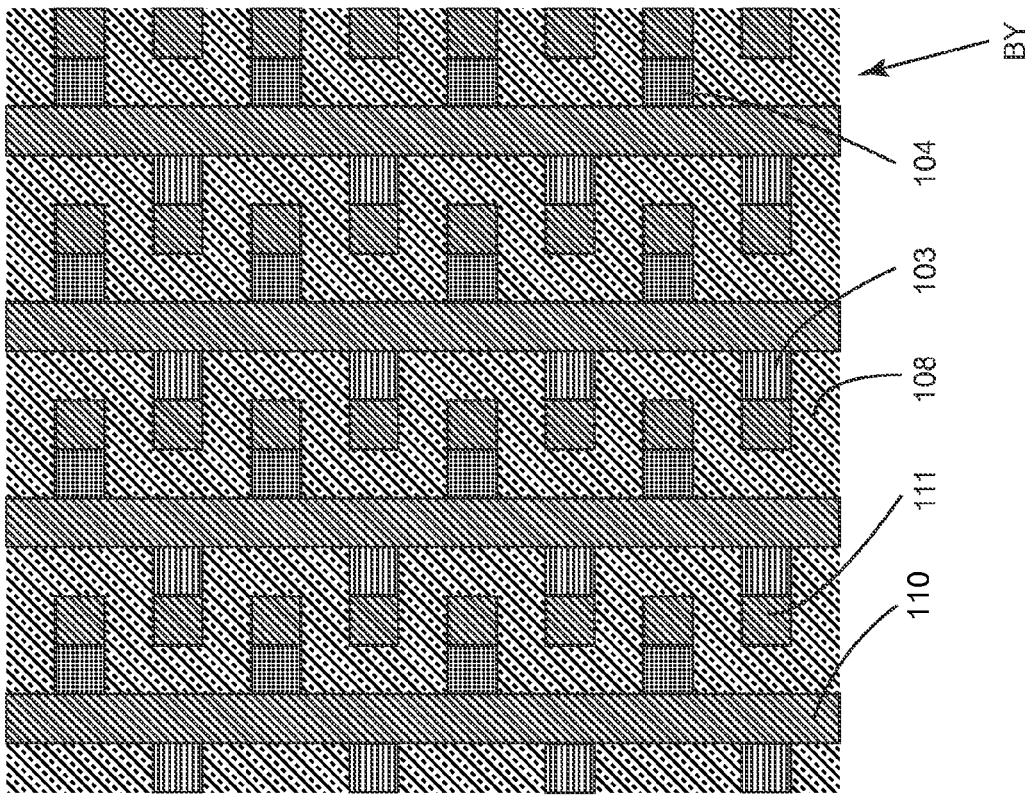
Figure 2B:
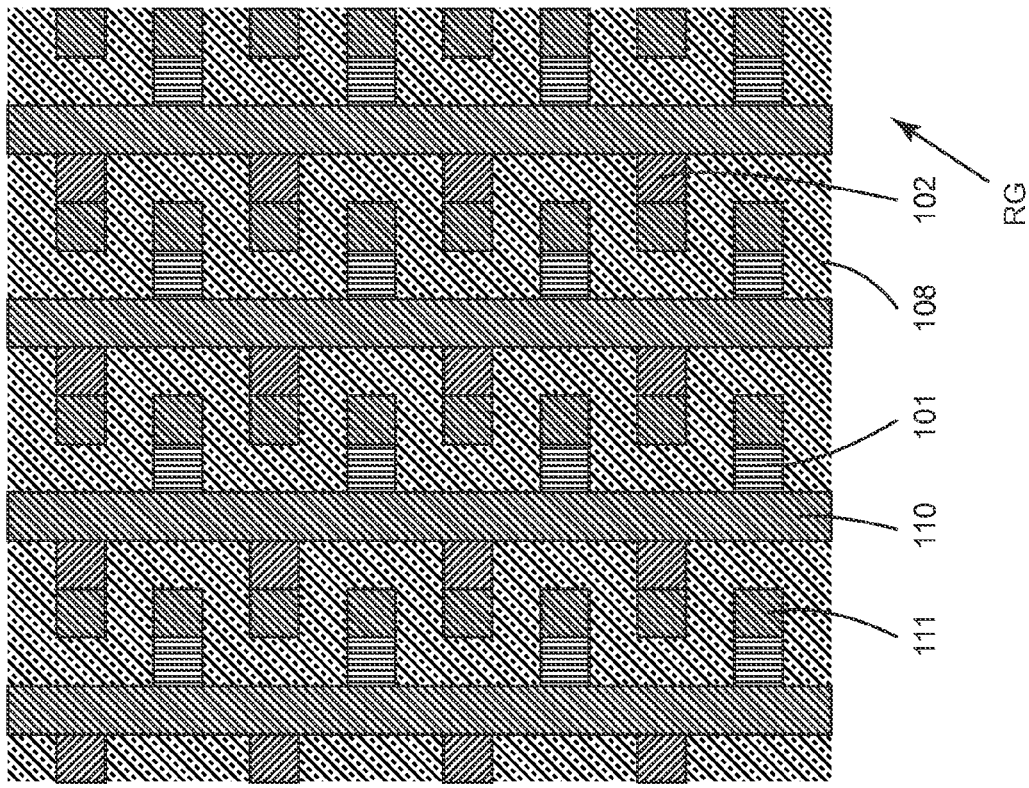

The figures depict a portion of a volumetric display 100 having a basic face-centered cubic arrangement of emitters 101-104 (which typically comprise the layers [such layers not depicted here] of a conventional inorganic or organic light emitting diode) including red emitters 101, green emitters 102, blue emitters 103, and yellow emitters 104. The structure is arranged so that there are repeating identically-oriented, evenly-spaced, regular tetrahedral shaped voxels comprising one of each emitter. (The tetrahedrons' edges are defined by imaginary lines connecting the emitters' centerpoints. "Centerpoint" as used herein generally just means the geometric three-dimensional center of the emitter structure, but for some emitters the source of light emission may be sufficiently separate from the geometric center as to behoove a mathematical assessment of the position of the center of the source as opposed to an overall diode feature or the like). The conductors 110 and 111 are preferably transparent, and there is preferably a transparent, electrically-insulating encapsulant 108. (As used herein, "encapsulant" does not imply any specific method of manufacture whatsoever, and merely refers to the structural relationship between the encapsulant and other parts of the display).

The conductor tips 110*t* are preferably permanently affixed to a side plate (not shown) that is aligned with the front right face of array of FIG. 1, and likewise with conductor tips 111*t* as to the top face. Sturdy design would be relatively more required of detachable side plates, but an economical version would be feasible if the side plates employ an array of X by Z, X by Y or Y by Z drive connection elements (where X, Y, and Z are the number of conductor tips in the corresponding columns or rows) that only or primarily consist of conventional wires and metal, adapted to connect to a controller connector on one side (e.g., with a X+Z or X+Y or Z+Y pin connector) and on their other side provided with contact pads or engagement features (e.g., flat, brushed, pointed, etc.) to engage and connect to the conductor tips. Alternately, the side plates could include a transparent, e.g., injection-molded mezzanine-style header that routes and narrows the leads down to a compact opaque cable. In either case, the side plates may permit connection to a conventional interface (e.g., HDMI), preferably either with a chip and/or firmware or software onboard (and suitable content delivered from the other side of the connection) to derive a useable signal.

A small-sized but high element-density embodiment can be adapted for compatibility with a mobile device capable of delivering volumetric three-dimensional content or otherwise usefully interacting with the display. In toy or artistic display embodiments, the display may preferably be powered with a rechargeable onboard battery such as a Li-ion battery pack, with the base of the device being appended to one of the side plates, and containing circuitry to permit it to display visually-interesting three-dimensional patterns stored in an onboard memory and/or delivered wirelessly by communication another device (e.g., through incorporation of a Bluetooth or Wi-Fi transceiver in the base).

In a face-centered cubic embodiment in which conductors 110 and 111 are laid out as depicted in the figures (with the planes of the associated sectional views containing only two colors of emitters each), if d is the distance between the center-points of each closest element to the next, the depicted planes of elements (where they intersect the elements' centerpoints) are pitched $$\sqrt{\frac{1}{2}}d$$

apart with the centerpoints of adjacent planes' elements staggered by $\sqrt{2}/2$ d. In an embodiment with the emitters' centerpoints arranged at the same positions as depicted in the figures, but with the conductors etc. instead laid parallel to the regular hexagonal grid-shaped planes that contain all four colors (these are the repeating "A/B/C" planes of the face-centered cubic pattern), then the emitter planes are pitched $$\sqrt{\frac{2}{3}}d$$

apart and each is identical except shifted by $$\left(\sqrt{\frac{3}{4}}+\sqrt{\frac{1}{12}}\right)d$$

vis-à-vis the plane above or below. In the latter embodiment, rather than having two sets of conductors that are arrayed at 90° angles to each other as depicted, there may be two sets of conductors arrayed at 120° angles to each other (although if the emitters are small enough relative to the insulating encapsulant 108, they alternately also could be wired at 90° angles). Such a wiring would naturally produce a somewhat unfamiliar 'open-book' shaped arrangement, which in most embodiments will enhance the display's multi-directional viewability.

The close-packed lattice/tetrahedral voxel arrangement enables meaningful enhancements in the depiction of motion, points, edges, and boundaries. When used with a four color emitter group, arranged by color as depicted in the figures, the tetrahedral voxel of such an arrangement can be moved up, down, left, right, back or forth in equal distances, but every such voxel also consists of two pairs of emitters each of which can form part of that voxel or another voxel. Consequently, the display can be driven (and the wiring arranged to facilitate) to move the element depicted by voxel "1" a fraction of a voxel away to occupy a voxel that occupies two of the emitters of original voxel "1." This can be done on a continual basis, preferably with the associated logic and computations performed by a suitable graphics processor, and permitting fidelity of motion not attainable otherwise. Similarly, every emitter can form part of eight different tetrahedral voxels; thus for example a voxel could swing or wheel through eight different and equally-close positions that all occupy the same emitter.

Another embodiment of the invention utilizes a generally conventional RGB (or other full-color producing) vertically-stacked emitter (see e.g., U.S. Patent Application Publication No. 2009/0078955 to Fan et al., which is incorporated herein by reference) as the close-packed elements. In this case, although as noted the space is not optimally filled, every emitter is surrounded by twelve other emitters that are equally close—a set of four spaced apart 90° from each other in each of three mutually-orthogonal planes. This means that for a given voxel depicting a moving element (of specified variable color) at a point in time, there will be twelve evenly-distributed available directions in which the depicted element can proceed to, and whichever way it moves, the new voxel depicting the element will likewise have direct freedom of motion in twelve directions. Because a simple cubic array permits only six direct degrees of freedom, the present embodiment makes possible an improved smoothness of displayed motion. This embodiment of course requires more intricate patterning to connect all four electrodes of each emitter stack to the corresponding conductors.

Figure 3B:
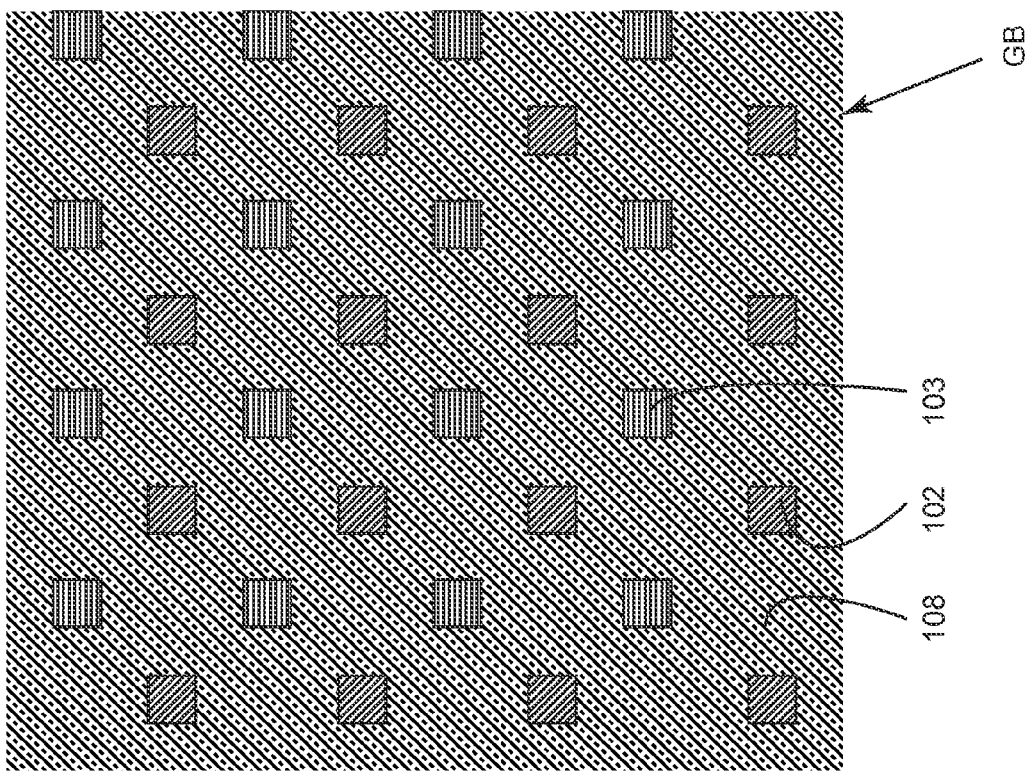
FIG. 3B shows a plane that is parallel to the plane of FIG. 3A and is like one indicated with the set of dashed lines indicated by GB in FIG. 1.
Figure 3A:
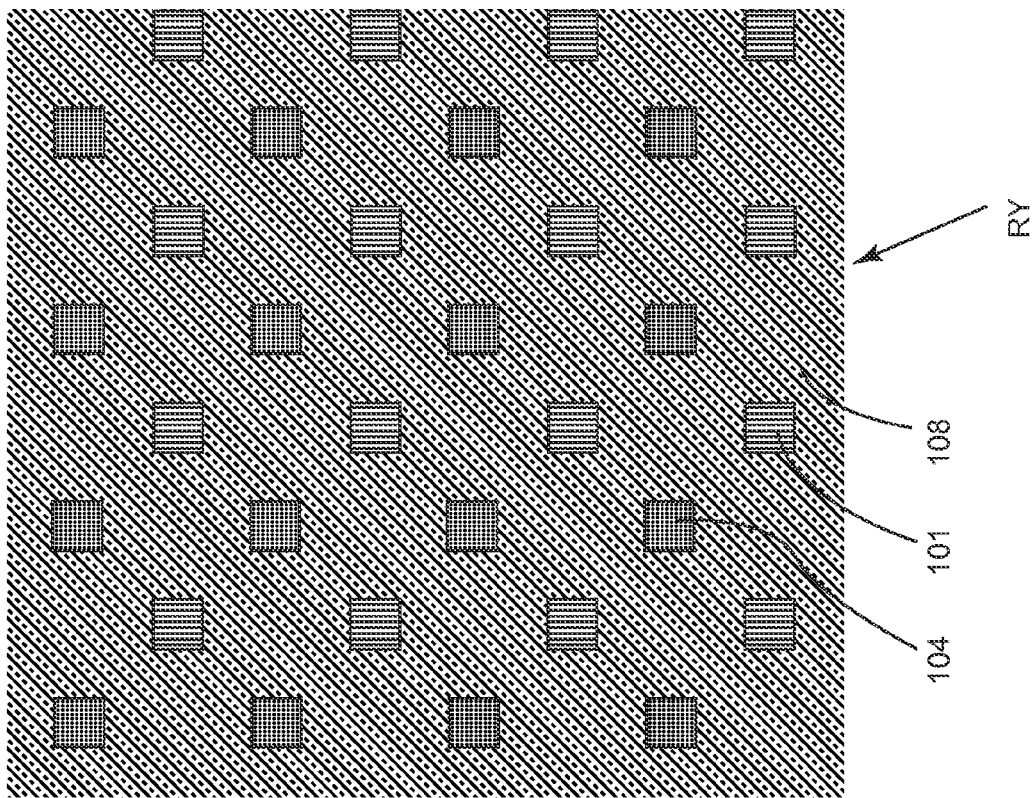
FIG. 3A shows a plane that is parallel to the one that generally appears as the left front face in FIG. 1, the depicted plane being like one indicated in FIG. 1 with the set of dashed lines indicated by RY.
Figure 4B:
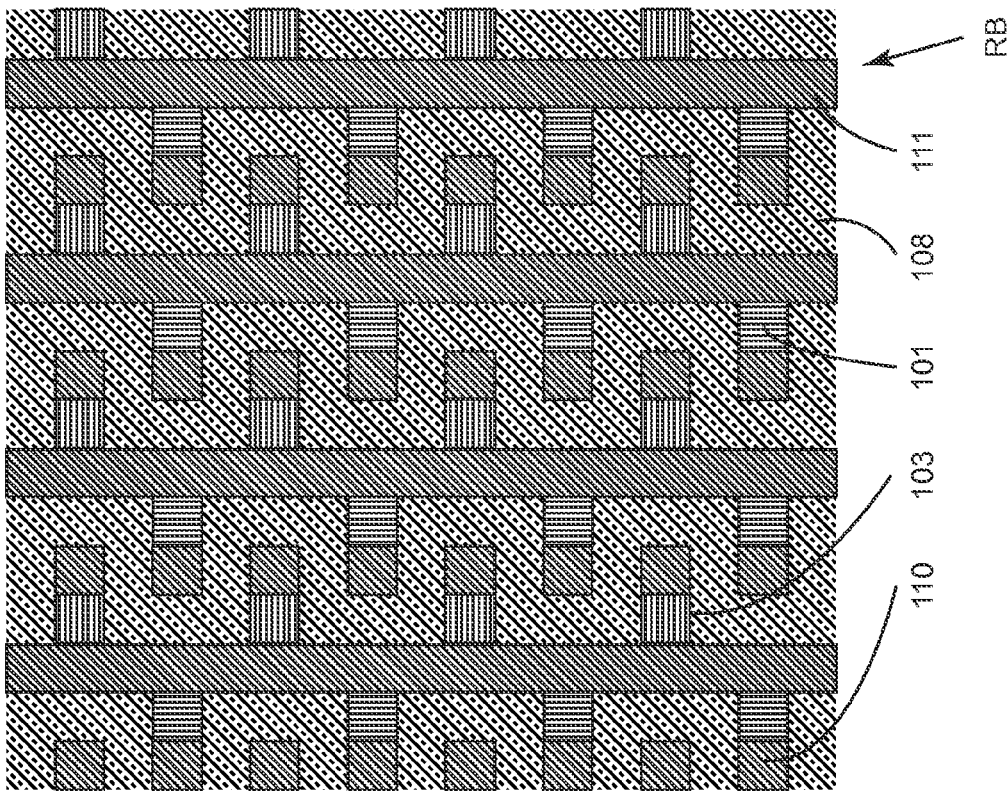
FIG. 4B shows a plane that is parallel to the plane of FIG. 4A and is like one indicated with the set of dashed lines indicated by RB in FIG. 1.
Figure 4A:
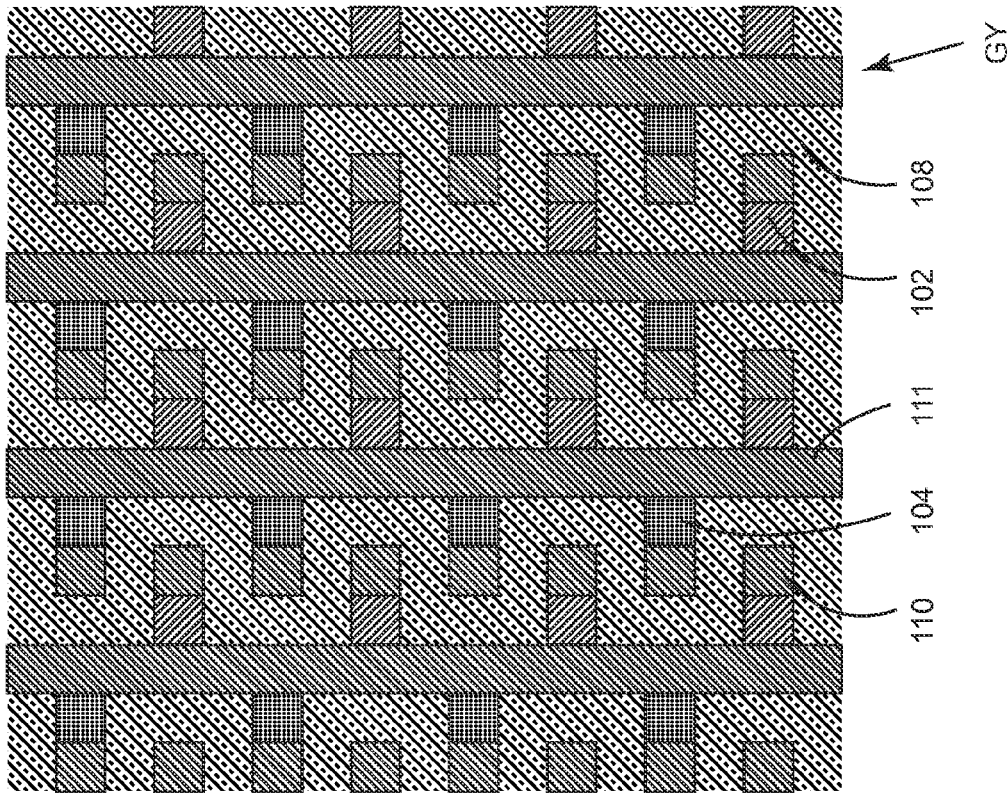
FIG. 4A shows a plane that is parallel to the one that generally appears as the right front face in FIG. 1, and which is indicated with the set of dashed lines indicated by GY in FIG. 1.
Figure 5B:
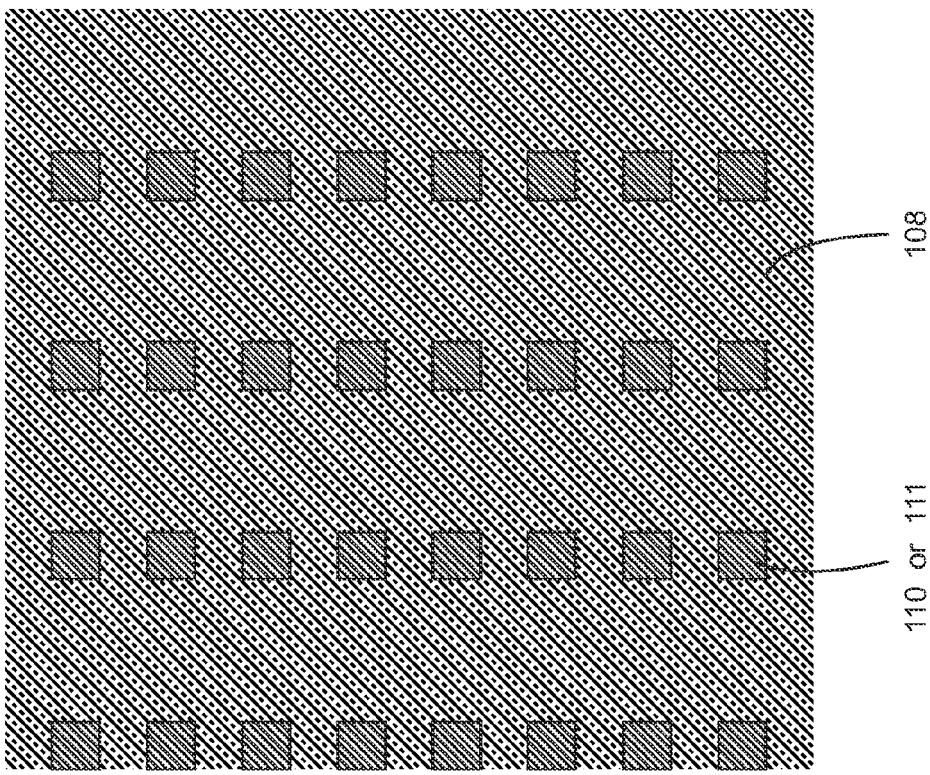
Figure 5A:
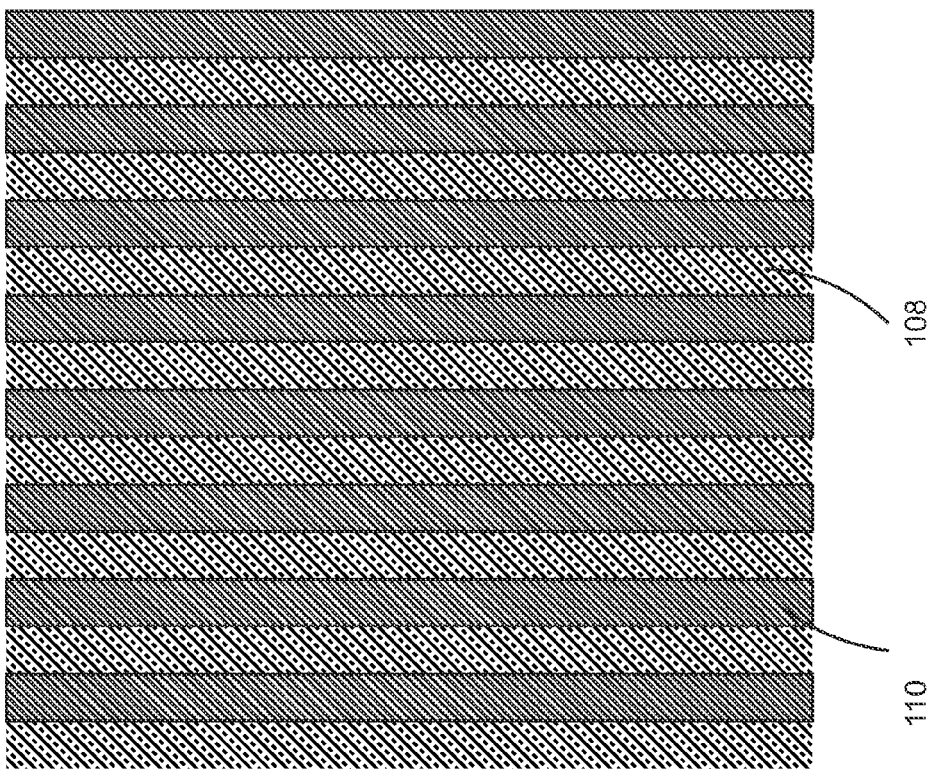
FIG. 5A shows a plane of a type that is found between the planes depicted in FIGS. 3A & 3B.

Centerpoints are the basis of measurements discussed here, and the relative sizing of the emitters, insulators, and conductors with respect to each other can be varied over significant ranges. The invention can be implemented using a variety of methods and at widely varying scales. A large (e.g., designed for outdoor or other distant viewing) embodiment may have a d of multiple millimeters or even centimeters and use high-powered (e.g., inorganic) emitters, while an embodiment utilizing transparent OLED materials can be made with a pitch of fractions of a millimeter. As will be appreciated from the patterns of emitters and conductors illustrated in FIGS. 3A, 3B, and 5A, at least in the wiring arrangement depicted, the invention is amenable to transparent OLED manufacturing techniques including those based on solution processing, spin or slot die coating, deposition and/or removal (sputtering, chemical, laser, UV, etc.), printing, micro-imprinting, etc., and combinations and hybrids thereof. The teachings of U.S. Pat. No. 7,667,396 to Chao and U.S. Patent Application Publication No. 2010/0308353 to Grabowski et al. in that regard are incorporated herein by reference, and as taught in Cho et al., Highly transparent organic light-emitting diodes with a metallic top electrode: the dual role of a Cs$_2$CO$_3$ layer, Optics Express 19:2, pages 1113-21, transparent OLED manufacturing techniques also include the incorporation of an electron-injecting/collecting buffer layer such as Cs$_2$CO$_3$ that also acts as a wetting/nucleation-promoting seed layer for a metal electrode layer (e.g., Ag) and may include a dielectric optical capping layer on the other side of the metal electrode layer (with the overall capped OLED stack then evaluated as a dielectric-metal-dielectric structure) to help maximize the luminous transmittance (T$_{lum}$) and match the optical admittance of the OLED stack with that of its medium by employing a capping layer with a suitable refractive index and having a thickness d$_{cap}$ optimized per:

$$T_{lum}(d_{cap}) = \frac{\int T_{OLED}(\lambda; d_{cap}) f_{photopic}(\lambda) d\lambda}{\int f_{photopic}(\lambda) d\lambda}$$

where $_{fphotopic}(\lambda)$ is the luminosity function at a wavelength $\lambda$ and weighted for the human photopic response (the authors describing a transparent OLED stack consisting of glass/ITO/(50 nm) NPB/(50 nm) Alq$_3$/(1.5 nm) thermal-evaporation deposited Cs$_2$CO$_3$/(15 nm) deposited Ag/(30±10 nm) thermal-evaporation deposited ZnS with a calculated T$_{lum}$ of 70-80%; d in the above equation denotes thickness, not the d used herein for the distance between centerpoints).

Layers are serially produced atop each other in the planes of the figures just noted, with spacing and layer heights as mathematically dictated above and overseen through manufacturing controls pertinent to a given process, with the conductors and emitters being surrounded by insulator 108. Conventional means are readily available to laterally align the layers in the aforementioned processes precisely; for example in a mask process, registration, and if necessary for a high resolution embodiment metrology, pattern recognition and/or other techniques can be employed. Likewise, certain manufacturing steps may call for conventional enhancements and adjuncts to ensure a consistent height of the portion being made. Rather than three-dimensionally thick, monolithic conductors 110/111 as depicted in the figures, in place of each conductor, two parallel thin conductor layers can be provided (not shown)—one contacting the line of emitters on one side (of the replaced conductor) and the other contacting the emitters on the other side—with encapsulant occupying the region between the conductor layers.

The display is preferably produced as an integral, monolithic solid part (although an embodiment could be made that entraps regions of fluid such as liquid crystal, without departing from the invention) that is substantially transparent when not energized, does not contain gas, and has materials and relative sizes chosen to mitigate transmission loss, reflection and refraction at layers (including due to birefringence), and to optimize the mixing of each voxel's light. "Substantially transparent" and the like intend that a material passes usefully-visible (for the purpose of a display) light in the context of the embodiment at issue. The insulator 108 preferably comprises PMMA, but it can also comprise polycarbonate or other polymers compatible with the chosen emitter makeup, conductor material, manufacturing methods, and intended use. Layouts that would incur cross-talk are to be avoided, as are configurations (including film thicknesses, etc.) that would create destructive or constructive thin film interference or diffraction; optically-enhancing, e.g., anti-reflective layers also may be applied.

Commercially dominant transparent conductor materials may be used, or performance can be increased by utilizing materials that have superior properties and are more convenient to process, such as nano-silver (e.g., Cambrios' ClearOhm® and U.S. Pat. No. 8,018,568 to Allemand et al., KeChuang's AW030; and see also Chung et al., *Solution-Processed Flexible Transparent Conductors Composed of Silver Nanowire Networks Embedded in Indium Tin Oxide Nanoparticle Matrices*, Nano Res, (Springer 2012), which discloses low temperature solution-deposited films of AgNW network embedded in ITO-NP matrix (and suggesting indium-free conductive metal oxide nanoparticles such as Al-doped ZnO and Sb-doped SnO may play an equivalent role to the ITO-NP in future electrode architectures) that demonstrated excellent mechanical adhesion and flexibility (noting those are requirements for compatibility with roll-to-roll processing), reduced wire-to-wire junction resistance, reduced surface roughness, and transmittance at 550 nm of 90.5% for a 44Ω/□ film, 88.6% for a 23Ω/□ film, and 85.3% for a 11Ω/□ film, with relatively constant transmittance from 400-800 nm, the films prepared by: spinning AgNWs solution (Seashell Technology AgNW-115, having nanowires about 115 nm thick and 30 μm long, diluted to 1 mg/mL) at 1000 rpm for 1 m onto 165 μm-thick PET substrate to form a randomly dispersed AgNW network, and sequentially spinning. ITO-NP solution (comprising equal volumes of 30 wt % ITO-NPs dispersed in isopropyl alcohol and 2.5 wt % PVA dissolved in deionized water) at 2000 rpm for 30 s onto the AgNW network, followed by thermal annealing around 100° C. for a few minutes to remove solvent; films with different resistance and transmittance values were obtained by repeated spin-coating processes), Zeng et al., *A New Transparent Conductor: Silver Nanowire Film Buried at the Surface of a Transparent Polymer, Advanced Materials* 22:4484-85(Wiley 2010), which discloses an example of AgNW in PVA matrix (produced at a deposition density of 47.7 mg/m$^2$) having 87.5% transmittance at 550 nm with a sheet resistance of 63Ω/□, a near-neutral color and high transparency across a wide range of the visible spectrum, 1-5 nm (rms) surface roughness, and excellent mechanical, thermal, and chemical robustness, the films prepared by: (1) synthesizing AgNWs (averaging 5.4 μm long and 49 nm thick) using an air-assisted polyol method by injecting 10 ml EG solution (0.1 M) of AgNO$_3$, 10 ml EG solution (0.6 M) of PVP, and 0.2 ml EG solution (0.032 M) of NaCl into a three-neck round flask equipped with thermocontroller and magnetic bar, heating to 198° C. within 20 m and maintaining at 198° C. for another 20 m all the while pumping air into the mixed solution, separating AgNWs by centrifugation and washing with deionized water and ethanol, and dispersing the AgNWs in ethanol or dionized water (titrating their concentration by Volhard method), (2) depositing a uniform AgNW network on a PET substrate by vacuum filtration using porous mixed cellulose ester filter membranes (0.2 μm pore size, Φ50-70 mm) and controlling deposition density by volume and concentration of filtered AgNWs dispersion, transferring the deposited AgNW film on MCE membrane to PET at 100° C. and a pressure of about 100 kPa for 2 h and peeling off the MCE to leave a uniform AgNW film on the PET, and (3) cast or spin-coating (1500 rpm for 15 s) a 10 wt % aqueous solution of PVA (PVA124, Kuraray) over the AgNW network (during which the PVA solution infiltrates pores and reaches the PET surface to form a smooth PVA/PET interface), drying at 80° C. for 1 h and 100° C. for another hour, and peeling the dried PVA matrix and AgNW (i.e., the AgNW-PVA film) from the PET surface; the authors noting also that nanowire could be buried in the surface of other transparent polymers such as polyimide and PET, and that the nanowire film's (4.26 eV) work function can be tuned to better match that of ITO by covering the PET (prior to coating it with the AgNW-PVA) with a thin (1-10 nm) layer of 4.6 eV work function graphene (spin-coated as a solution made by alkaline deoxygenation); and demonstrating a AgNW-PVA/(67 nm) PEDOT:PSS/(60 nm) NPB/(60 nm) Alq$_3$/(1 nm) LiF/(100 nm) Al organic light-emitting device to have excellent power efficiency (maximum of 2.43 lm/W at 45.8 mA/cm$^2$ versus a comparable ITO-based sample's maximum of 1.62 lm/W at 277.2 mA/cm$^2$), the OLED prepared by patterning AgNW film on glass (47.8 mg/m$^2$, 40 mm×40 mm) into two parallel electrodes (3 mm×40 mm) by tape adhesion, casting 10 wt % PVA solution on glass and heating at 80° C. for 4 h and peeling off, drying the patterned AgNW-PVA sheet at 100° C. for 6 h, spin-coating aqueous PEDOT:PSS (Baytron P VP Al 4083 from H.C. Stark) on the patterned AgNW-PVA sheets at 1500 rpm for 15 s and drying at 110° C. for 30 m and cutting into 30 mm×30 mm sheets, vacuum-depositing the NPB and Alq$_3$ layers, and thermally evaporating the LiF and Al cathode layers (with the PEDOT:PSS used as the smooth layer and to adjust the anode's work function), Hu et al., *Scalable Coating and Properties of Transparent, Flexible, Silver Nanowire Electrodes*, ACS Nano 4:5, pages 2955-63(2010), which discloses the controlled synthesis of high- aspect ratio (30-50 nm thick, ~10 μm long) AgNWs by heating and thermally stabilizing a mixture of 668 mg poly-vinylpyrrolidone, 10 mg of KBr, and 20 mL ethylene glycol at 170° C. in a flask, adding 50 mg of finely-ground AgCl (for initial nucleation), then after 3 m titrating 220 mg of AgNO$_3$ for 10 m, heating the flask an additional 30 m, centrifuging the cooled-down solution at 2000 rpm for 30 m, then centrifuging the supernatant twice at 6000 rpm for 30 m to precipitate the AgNW, and re-dispersing the AgNW precipitant in 5 mL of methanol; and which discloses a technique of rod coating such AgNWs that is scalable to roll-to-roll, slot die or gravure coating as follows: bath-sonicating a 2.7 mg/mL AgNW ink in methanol solution for 10-30 s, dropping 200 μL of the AgNW ink on a 120 μm thick PET substrate, pulling or rolling a Meyer rod (RDspecialist Inc.) over the solution to leave a uniform 4-60 μm layer on the substrate, drying the AgNW coating with heat applied uniformly by infrared lamp, and after initial drying at 65° C. oven-drying at 120° C. to anneal and improve sheet conductance, and pressing the film at 81 GPa for 50 s (to increase conductance and reduce surface roughness; surface roughness also could be reduced to 1-2 nm by encapsulation with conducting polymers, and adhesion of the AgNW-coated film to plastic substrate can be improved by encapsulation with a 20 nm-thick Teflon® layer), 20Ω/☐ examples of the resulting films having 500 nm specular transmittance greater than 80% (resistance can be further reduced by galvanic displacement with Au by 15 m immersion in a boiling 7 μM HAuCl$_4$ aqueous solution and drying with an air gun to yield Au-coated AgNWs), U.S. Patent Application Publication No. 2011/0094651 to Kuriki, which is incorporated herein by reference, and Spechler et al., *Direct-write pulsed laser processed silver nanowire networks for transparent conducting electrodes*, Applied Physics A (Springer 2012) which discloses the reduction of sheet resistance of AgNW film by fusing the wire-to-wire junctions with pulsed monochromatic 355 nm laser processing for a total exposure time of 30 μs at a 35-50 mJ/cm$^2$ fluence range in a direct-write fashion that can also be used to create a user-specified microstructure or pattern), carbon nanotubes (see e.g., Hecht et al., *Transparent conductive carbon-nanotube films directly coated onto flexible and rigid polycarbonate*, J. Soc. Info Display 19:2, pages 157-62 (2011), which discloses polycarbonate substrates (noting PC's higher optical transmission and glass-transition temperature versus PET) of 5 mil and 1 mm thicknesses coated with visually- and electrically-uniform transparent CNT films at dry thicknesses of 5-20 nm using an aqueous-based ink and standard wet-coating techniques, noting the measured transmittances (including a ~335Ω/☐ film with ~91.8% transmittance for the CNT film and ~83.6% for the CNT film plus PC substrate) are within 10% of comparable CNT coatings on PET, PEN, and glass, finding the CNT/PC film to be stable at high-temperature and noting the relevance of that to manufacturing curing steps, and finding it to be durable and noting the relevance of that to manufacturing where roll-to-roll processing and handling are issues, and finding it to be chemically compatible/durable against acrylic acid and noting the relevance of that to the design of devices with acid-containing layers such as PEDOT:PSS, and noting that CNT coatings' flat transmission spectrum over the visible wavelength range lead to a neutral gray colored film, and noting the CNT film can be patterned by laser-ablating it from the substrate to produce complete isolation with sharp and well-defined edges that are smooth on the length scale of 100 μm; the CNT/PC film being prepared by: growing CNTs via chemical vapor deposition, purifying them via air oxidation and acid washing, dispersing them into a surfactant-stabilized water-based ink, spray coating the ink (to achieve film densities ≥10× the percolation threshold) at room temperature onto 5 mil or 1 mm PC heated to 100° C., aqueous washing the films to remove residual surfactant, and blow-drying them, and graphene. (Also see e.g., Moon et al., *2D Graphene Oxide Nanosheets as an Adhesive Over-Coating Layer for Flexible Transparent Conductive Electrodes*, Scientific Reports 3:1112(2013), discloses the use of graphene oxide as an ultrathin overcoating on indium-free transparent conductive electrodes, finding the GO overcoating to significantly reduce sheet resistance and surface roughness (to 4.84 nm) while also reducing haze and reflectance and improving transmittance (over 92% at 550 nm for a 24.8Ω/☐ average sheet resistance) and mechanical and chemical durability and to yield good electrical and optical uniformity and fairly neutral color, when applied to AgNW film on PET substrate treated with plasma (to increase hydrophilicity), showing the GO layer to strongly adhere to the hydrophilic substrate and encapsulate the AgNW between it and the substrate, and revealing the GO overcoating's sheet resistance reduction to improve markedly as the film's AgNW density goes below a point corresponding to a non-overcoated sheet resistance somewhere between about 27-58.8Ω/☐, with the GO/AgNW/PET prepared by: producing single-layer GO nanosheets with ~50 μm flake size and concentration above ~80% by chemical graphitization adapted from Hummers' method (per Moon et al., *Reduced graphene oxide by chemical graphitization*, Nature Communications, 1, 73 (2010)), pre-treating 10×10 cm$^2$ PET substrate with 3% O$_2$/Ar plasma up to 50 s (with good maximum local and mean sheet resistance results obtained at 50 s), bar- coating AgNW ink (density varied by dilution with isopropyl alcohol) pipetted in a line at the top of the PET substrate, within 1 s hand-pulling a #10 Meyer rod down over the AgNW ink, drying the AgNW/PET 4 m in a 140° C. oven, treating the AgNW/PET with 3% O$_2$/Ar plasma again for 1 m, and thrice spraying a 27.5 mg/L aqueous solution of the GO nanosheets on the AgNW/PET; and disclosing an Au/GO/AgNW/PET device having two Au electrodes (deposited by thermal evaporation, about 130 μm apart separated by a shadow mask)

between which was displayed current-voltage linearity (suggesting a good ohmic contact or a direct tunneling junction) and current stability under 1.5V for 20 ks).

In most embodiments, the choice of encapsulant and conductor material(s) will in part limit each other or dictate additional steps such as refraction index tuning, anti-reflective layers, optical bonding or laminating, etc. The refractive index of each should be matched well to the other (and tuned if desirable—see e.g., Hanemann, *Tuning the polymer refractive index with nanosized organic dopants*, SPIE Newsroom (Nov. 5, 2008), which teaches that dissolving nanosized organic phenanthrene-type molecules (phenanthrene, 9-bromphenanthrene, 9-cyanophenanthrene, benzochinoline, or triphenylmethane) in a reactive polymer resin of methyl methacrylate/polymethyl methacrylate (PMMA) increases the refractive index of the resulting cured polymer linearly based on the dopant concentration (with benzochinoline varying the index from about 1.49 to 1.58 at 45 wt %) and finds similar results using benzylmethacrylate or epoxide as the polymer matrix. For example, the index of refraction of the insulator and the refraction index profile of the transparent conductors may be matched within 5%, 2%, 1%, or 0.5%. PMMA's index is fairly close to PEDOT:PSS and some embodiments of nanosilver and carbon nanotubes solutions. To the extent that birefringent materials are used, steps may be taken to mitigate the effects of that, including optimizing anisotropic orientations and possibly the addition of a negatively-birefringent film. A glass-encapsulated embodiment may utilize a high refraction index glass chosen to better match ITO or the like, in which case optical bonding may also be employed, as can lamination in the case of an OLED/polymer embodiment.

A wide range of emitter types are suitable, including inorganic LEDs, OLED, hybrid LED/OLED structures, nanowire LED (see e.g., U.S. Pat. No. 8,129,710 to Cho et al.), and others. The emitters in most embodiments should be of a form, shape, and materials selected for a low angular spectral dependence, particularly in the preferred embodiments wherein the array has a significant depth (meaning eight or more layers) and the display is intended for viewing over a broad range of angles. One embodiment utilizes OLED emitters and compatible transparent materials, but has two dimensions that are significantly greater than the third, which comprises at least eight RGBY layers, preferably one or a few dozen. Such an embodiment can be rendered like a three-dimensional, volumetric 'fish-tank' style display that a user can view up close to see a number of individual objects being depicted, with sharpness and smoothness of motion that is enhanced over conventional and prior art stacked OLED displays.

Though numerous well-known processes can be used depending on the embodiment, some embodiments would also be amenable to somewhat unconventional processes. For example, an array of pre-formed polymer (or glass) rectangular-profiled rods (preferably with embedded or attached emitters) could be assembled in registration and pressed together and heated, either all at once, or layer-by-layer, hermetically encapsulated under vacuum; such rods could be manufactured from flat layers of insulator coated on their surfaces with the relevant conductor materials (such as with the nanoAG method used by Chung et al., supra, which may reduce the effects of refraction index changes) and then e.g., laser-cut into strips. As another example, an embodiment may be produced in part by molding and then joining sheets like those of FIGS. 3A, 3B and 5A (preferably with two layers of film used as conductors in place of each of the ones depicted).

Subvoxel mixing of perceived colors could be enhanced structurally by selecting and configuring emitters to have maximally overlapping étendues, and employing techniques appropriate to a given embodiment such as light guiding, diffusing, or in the case of directional (e.g., side-emitting) emitters, mutual reflection between two emitters (such as the two pairs that comprise a tetrahedral voxel in the depicted embodiment). A possible hybrid LED embodiment could include very small, low-power inorganic LEDs, with variable conductivity leads that gradually get wider and less conductive toward a larger transparent conductor contact area. Small inorganic LEDs arranged in the face-centered cubic lattice could include side-emitting LEDs (with or without Lambertian or OLED-profile emitters also in a given voxel) and might lend themselves to electrochromic mixing.

A display made according to the invention also is favorably amenable to multiple wiring methods, many including lines of a single color emitter (such as in the figures if the conductors are replaced with two opposing film layers as described above) so as to facilitate driving schemes that benefit from physically-divided color channels. As noted, multiple 90° or 120° orientations (and their corresponding device shapes) can be employed. The wiring also can be done to multiplex (using pulse width modulation) the emitters of an embodiment such as that depicted in the figures, though in some embodiments the extent of this option is limited by the capacity of the conductor material (or other performance related issue such as cross-talk in an overly-dense layout) before noticeable boundaries of the persistence of vision effect are passed. In some embodiments, such as a small 8×8×4 or 8×8×8 toy or a like- or moderately greater-number of voxel visual art display embodiment, the display may not have enough voxels to render realistic content but still can generate a smoother flow of light and patterns for the reasons described herein. The persistence of vision ("p.o.v.") effect can also be exploited for enhanced perceived movement vis-à-vis the p.o.v. effect in a display without the arrangements described herein.

The use of four-color emitter groups creates a design choice in driving the emitters to depict the color space, as there is not a unique solution (of relative light intensities, or equivalently pulse width modulation values) for a given desired light frequency as with three-color groups. Various current makers of commercial products utilize RGBY (or RGBA (to be distinguished from RGBa)) to do so, including Sharp (Acquos®) and Norlux Corp. of Illinois (a provider of to-spec LED lighting drive circuitry including for RGBY), and others. A somewhat generic solution to four-element programming could include calculating an RGB set of values, an RBY set of values, RGY, and GBY, and averaging or interpolating them for a single RGBY value; also, a plethora of visually-distinct and entertaining solutions (preferably accentuated by smooth voxel motion) for a toy or artistic visual display embodiment could be easily devised by one of ordinary skill.

Diverse embodiments of the present invention are likely to be further enhanced by means of Bright Pupil or Dark Pupil eye-tracking to locate the position of the viewer relative to the array, and employ a processor (onboard, in a graphics processor assembly, etc.) to provide an even, controlled effective display to the user over time and at different viewpoints, drive the units that are 'rearward' from the user's perspective with higher power and/or different driving characteristics so as to normalize the elements' output with respect to each other based on their currently expected relative light loss. This effect also can be applied, depending on the configuration, to normalize elements' perceived output through changing relative alignment of the user's position and the emitter's étendue, and to modify output color to offset any angular spectral dependence and/or wavelength-dependent differential rate of loss of the emitters' visible output through the materials used.

The embodiments discussed herein have assumed the practical desirability of passive addressing to avoid the intervening layers of active electronics such as TFT, however, it is believed that (at least for smaller arrays) such can be implemented reasonably well even with existing transparent TFT. These and other readily apparent implementations and modifications are within the scope of the invention; unless indicated, the particulars of preferred embodiments described above are not meant as limitations on the following claims.

What is claimed is:

1. A volumetric three-dimensional light-emitting display, comprising: an array of elements arranged, as defined by the relative positions of the elements' centerpoints, in a close-packed relationship that forms regular tetrahedrons between adjacent centerpoints, wherein each element's centerpoint is defined by the three-dimensional position of the element's source of visible light; and an array of electrical conductors, wherein each element is in electrical contact with exactly two electrical conductors configured to energize the element, and wherein the array of elements comprises voxels that each consist of four elements and each voxel is capable of generating full color.

2. The display of claim 1, wherein the array of elements is arranged in a face-centered cubic lattice.

3. The display of claim 1, wherein the display includes electrochromic elements.

4. The display of claim 1, wherein the array of electrical conductors includes electrical conductors that are aligned with and in contact with linear rows of like-color elements.

5. The display of claim 1, wherein the elements comprise light emitting diodes.

6. The display of claim 1, wherein the display comprises regularly-repeating layers joined together.

7. The display of claim 1, wherein each voxel is defined by four differently-colored emitters.

8. The display of claim 1, wherein the electrical conductors are substantially transparent.

9. A volumetric three-dimensional light-emitting display, comprising: an array of elements arranged, as defined by the relative positions of the elements' centerpoints, in a close-packed relationship that forms regular tetrahedrons between adjacent centerpoints, wherein each element's centerpoint is defined by the three-dimensional position of the element's source of visible light; and an array of substantially transparent electrical conductors in electrical contact with the array of elements; and an electrically-insulating material that is substantially transparent; wherein the array of elements comprises voxels that each consist of four elements and each voxel is capable of generating full color.

10. The display of claim 9, wherein the four elements comprising a voxel are each different.

11. The display of claim 9, wherein the electrical conductors includes electrical conductors that are aligned with and in contact with linear rows of like-color elements.

12. The display of claim 9, wherein the display is monolithic and all the elements and all the electrical conductors are substantially fully encapsulated by the insulating material.

13. The display of claim 12, further comprising a first takeoff plate comprising an array of contacts to or continuations of a first set of electrical conductors, and a second takeoff plate comprising an array of contacts to or continuations of a second set of electrical conductors.

14. The display of claim 9, wherein the array of electrical conductors comprises a first set of parallel conductors and a second set of parallel conductors.

15. The display of claim 14, wherein the two sets of electrical conductors are arrayed at an angle with respect to each other that is chosen from one of the following values: 90°, or 120°.

16. The display of claim 14, wherein at least one set of electrical conductors comprises nanoAG, carbon nanotubes, or graphene.

17. The display of claim 9, wherein the display is further adapted to perform eye-tracking.

18. The display of claim 9, wherein the electrically-insulating material comprises PMMA.

19. The display of claim 9, wherein the electrically-insulating material is doped or otherwise tuned to better match the index of refraction of the electrical conductors.

20. A three-dimensional light-emitting display comprising:
  a. a first planar array of elements wherein the centerpoints of closest-adjacent elements are spaced apart from each other by a distance d;
  b. a second planar array of elements wherein the centerpoints of closest-adjacent elements are also spaced apart from each other by the distance d;
  c. wherein the second planar array is parallel to the first planar array and is pitched apart from the first planar array by a distance that is a first function of d, and wherein the centerpoints of the elements of the first planar array are laterally staggered apart from the centerpoints of the elements of the second planar array by a distance that is a second function of d;
  d. a first set of electrical conductors between the first planar array and the second planar array;
  e. a second set of electrical conductors on the other side of one of the first planar array or the second planar array;
  f. wherein the display comprises voxels that each consist of four elements and each voxel is capable of generating full color, and either:
    i. the elements of the first planar array are arranged orthogonally within the first planar array, each element is in electrical contact with exactly two electrical conductors configured to energize it, and the second function of d is $d\sqrt{2}/2$; or
    ii. the elements of the first planar array are arranged hexagonally within the first planar array, each element is in electrical contact with exactly two electrical conductors configured to energize it, and the second function of d is $$\left(\sqrt{\frac{3}{4}} + \sqrt{\frac{1}{12}}\right)d.$$

21. The display of claim 20, wherein the first and second sets of electrical conductors are substantially transparent.

22. The display of claim 21, further comprising an electrically-insulating material that is substantially transparent.

23. The display of claim 22, further comprising a plurality of additional layers each consisting of two planar arrays of elements and two sets of electrical conductors as recited in parts a-f, the layers positioned so that a planar array in each layer is pitched apart from a planar array in an adjacent layer by a distance that is the first function of d.

24. The display of claim 23, wherein all the elements and all the electrical conductors are substantially fully encapsulated by the insulating material.

25. The display of claim 24, wherein at least one set of electrical conductors comprises nanoAG, carbon nanotubes, or grapheme.

26. The display of claim 24, wherein the electrically-insulating material is doped or otherwise tuned to better match the index of refraction of the electrical conductors.

27. The display of claim 24, wherein the electrical conductors of the first set of electrical conductors are parallel to each other and the electrical conductors of the second set of electrical conductors are parallel to each other.

28. The display of claim 27, wherein the first function of d is $d\sqrt{2/3}$ and the first set of electrical conductors is arrayed at a 90° or 120° angle with respect to the second set of electrical conductors.

29. The display of claim 24, wherein the elements are light emitting diodes.

30. The display of claim 29, wherein either:
i) the second function of d is $d\sqrt{2}/2$ and the elements of the first planar array are arranged orthogonally within the first planar array, and the elements of the first planar array consist of exactly two colors of elements and the second planar array is different from the first planar array, or
ii) the second function of d is $$\left(\sqrt{\frac{3}{4}} + \sqrt{\frac{1}{12}}\right)d$$

and the elements of the first planar array are arranged hexagonally within the first planar array, and the elements of the first planar array consist of more than two colors of elements and the second planar array is substantially identical to the first planar array.

* * * * *